United States Patent [19]
Hirai

[11] Patent Number: 5,332,916
[45] Date of Patent: Jul. 26, 1994

[54] TRANSMISSION GATE

[75] Inventor: Jun Hirai, Kyoto, Japan

[73] Assignee: Rohm Co., Ltd., Kyoto, Japan

[21] Appl. No.: 951,852

[22] Filed: Sep. 28, 1992

[30] Foreign Application Priority Data

Sep. 30, 1991 [JP] Japan ................................. 3-278738

[51] Int. Cl.[5] .......................................... H01L 27/02
[52] U.S. Cl. .................................... 257/369; 307/585
[58] Field of Search ............... 257/364, 365, 368, 369,
257/664; 307/296.2, 296.8, 571, 576, 585

[56] References Cited

U.S. PATENT DOCUMENTS 5,146,112 9/1992 Ito et al. ............................... 257/357
5,157,282 10/1992 Santin et al. ...................... 307/296.8

Primary Examiner—J. Carroll
Attorney, Agent, or Firm—Fay, Sharpe, Beall, Fagan, Minnich & McKee

[57] ABSTRACT

A transmission gate having a CMOS structure wherein an NMOS transistor and a PMOS transistor are connected in parallel between an input signal line and an output signal line and a separation layer which separates a transistor formation region for one of the PMOS transistor and the NMOS transistor formed in a substrate from the substrate, wherein the back gates of the respective transistors are constituted to receive an input signal from the input signal line when the one transistor and the other transistor formed in a well region are in a conductive state.

19 Claims, 5 Drawing Sheets

TRANSMISSION GATE

BACKGROUND OF THE INVENTION

1. Field of the Invention

The present invention relates to a transmission gate, and more specifically relates to an improvement to a transmission gate which makes use of a substrate modulation for reducing distortion of transmitting signals.

2. Description of Related Art

A transmission gate is one of so called analogue switches and renders conductive or non-conductive between an input signal line and an output signal line in response to a control signal. An ideal transmission gate transmits an input signal to the output side without distortion when it is in a conductive state and outputs the input signal as it is as the output signal. However, when a transmission gate is constituted by a single element of a transistor, the resistance value of the transmission gate varies non-linearly depending upon the voltage of an input signal to thereby extremely distort the signal transmitted.

As one of measures for reducing such transmission distortion the resistance value of the transmission gate during its conductive state is linearized. As a specific example of such measure transmission gates of a CMOS circuit constitution as shown in FIG. 7 and FIG. 8 are used wherein a P channel MOS transistor (hereinafter simply called as PMOS transistor) and an N channel MOS transistor (hereinafter simply called as NMOS transistor) are connected in parallel.

FIG. 7 shows a fundamental constitution of a conventional transmission gate, wherein 1 is an NMOS transistor and 2 is a PMOS transistor. These transistors connected in parallel perform a switching function. When there are neither a control signal C nor its inverted signal *C, the both transistors 1 and 2 are in an "OFF" (non-conductive) state and the input signal line (or input terminal) and output signal line (or output terminal) are disconnected. When the gate receives a control signal C and its inverted signal *C, the both transistors 1 and 2 are rendered to an "ON" (conductive) state. At this moment, the NMOS transistor 1 and the PMOS transistor 2 exhibit resistance values of opposing characteristic with respect to the voltage of an input signal A, thereby linearity effected by the composite resistance value of these transistors is improved in comparison with that by the single element of a transistor. Further, pulse signals such as usual clock signals are used for the control signal, and its inverted signal is obtained by supplying the control signal via an inverter as illustrated in the drawing.

FIG. 8 shows a constitution of a conventional transmission gate which is subjected to a substrate modulation. In this circuit, a switching circuit 4 which connects the back gate of the transistor 2 to a power source Vcc (+) when there are neither a control signal C nor its inverted signal *C and a switching circuit 3 which connects the back gate of the transistor 2 to the input signal line when both a control signal C and its inverted signal *C are received, are added to the fundamental constitution as shown in FIG. 7. Via the function of these switching circuits 3 and 4 the back gate of the transistor 2 is subjected to a modulation by the input signal A, thereby the linearity of the resistance value of the transmission gate is further improved.

Via the application of the modular ion to the substrate as explained, the back gate of the transistor is applied a modulation by the input signal thereby the transmission distortion in the transmission gate is improved to some extent. However, the substrate modulation as the name indicates does not directly apply modulation to the back gate but applies to the substrate directly connected to the back gate to thereby apply a modulation to the back gate. For this reason the modulation is only applicable to either one of the transistors connected in parallel.

Namely, when the transmission gate is formed on a P type substrate, the NMOS transistor in a CMOS is formed in a P well region and is electrically isolated from the P type substrate so that the substrate modulation is only possible to the NMOS transistor. Further, when the transmission gate is formed on an N type substrate, in the same manner the PMOS transistor is electrically isolated from the N type substrate, thereby the substrate medulation is only possible to the PMOS transistor.

Accordingly, the resistance value of the transistor which can not be modulated by the input signal is not improved and the linearity of the composite resistance value when the parallel transistors are in a conductive state is still poor. As a result, with the above explained conventional transmission gate, the transmission distortion of signals is not sufficiently suppressed.

SUMMARY OF THE INVENTION

An object of the present invention is to provide a transmission gate in which the composite resistance characteristic effected by parallel transistors is improved and the transmission distortion of signals are reduced.

Another object of the present invention is to provide a transmission gate having a CMOS constitution which realizes a resistance value of approximately linear characteristic by making use of a substrate modulation.

The transmission gate having a CMOS structure according to the present invention which is constituted by connecting an NMOS transistor and a PMOS transistor in parallel between an input signal line and an output signal line is characterized by being provided with a separation layer which separates a transistor formation region for one of the NMOS transistor and the PMOS transistor formed in a substrate from the substrate, whereby the both back gates of the separated transistor and the other transistor formed in a well region receive an input signal from the input signal line when the both transistors are operative in a conductive state.

With the above constitution, both the NMOS transistor and the PMOS transistor connected in parallel are subjected to modulation by an input signal at their back gates to thereby improve their resistance characteristics at the same time. As a result, the linearity of the composite resistance in the transmission gate as a whole is improved, thereby an input signal is transmitted with little distortion to an output side and the input signal is made as an output signal almost as it is.

Further, a more specific constitution of the transmission gate having a CMOS structure according to the present invention comprises a buried separation layer which is disposed beneath a region for one of an NMOS transistor and a PMOS transistor formed in a substrate and separates the transistor formation region from the substrate, a first switching circuit which conducts the back gate of the PMOS transistor to a positive reference voltage line when a control signal (or its inverted signal) is received, a second switching circuit which conduct the back gate of the PMOS transistor to an input signal line when the inverted signal of the control signal (or the control signal) is received, a third switching circuit which conducts the back gate of the NMOS transistor to a negative reference voltage line when the inverted signal of the control signal (or the control signal) is received, and a fourth switching circuit which conducts the back gate of the NMOS transistor to the input signal line when the control signal (or its inverted signal) is received.

With the thus constituted transmission gate, in addition to the improvement of the resistance characteristic thereof as explained above, both the PMOS transistor and the NMOS transistor connected in parallel exhibit high resistance values during their "OFF" condition, since the their back gates are respectively connected to the positive reference voltage and the negative reference voltage when there are no control signals. Accordingly, the input signal line and the output signal line are completely disconnected and the transmission gate performs a sufficient analogue switch function.

DESCRIPTION OF THE PREFERRED EMBODIMENTS

Figure 1:
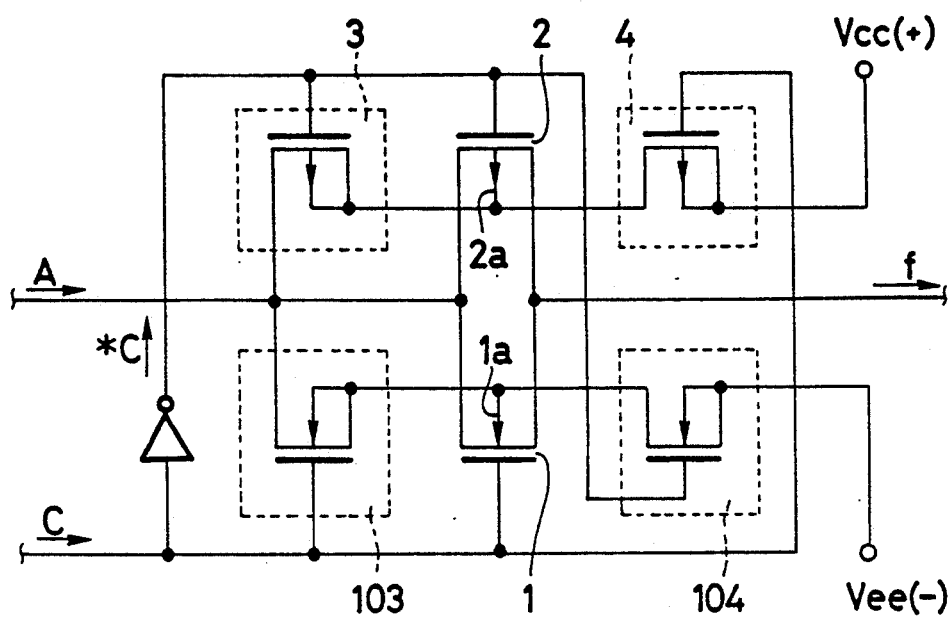
FIG. 1 is a circuit diagram showing the specific constitution of one embodiment of transmission gates according to the present invention.
Figure 7:
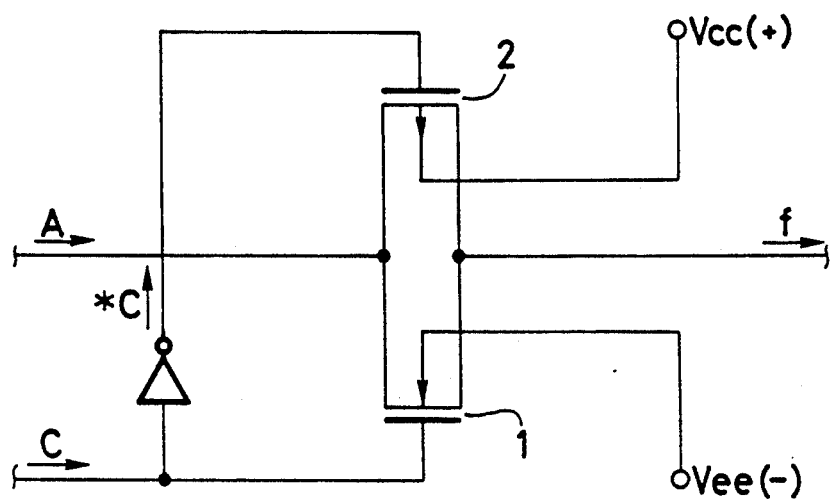
FIG. 7 and FIG. 8 are respectively circuit diagrams of transmission gates having conventional constitutions.
Figure 8:
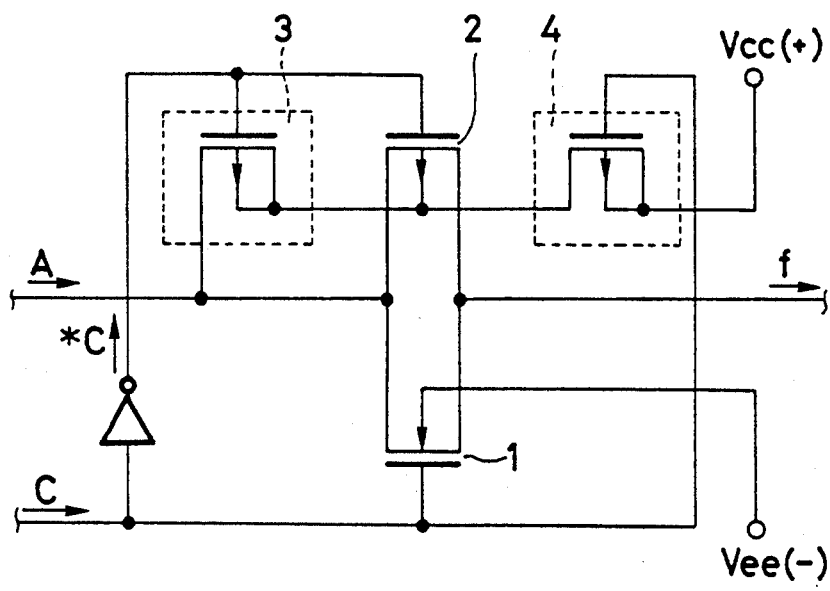

The transmission gate shown in FIG. 1 is further provided with switching circuits 103 and 104 in addition to the elements of the transmission gate shown in FIG. 8 and is constituted to perform a modulation by the input signal A even for the transistor 1 shown in FIG. 8. The transmission gate shown in FIG. 1 is constituted by providing both the NMOS transistor and the PMOS transistor of the transmission gate having a CMOS structure with a switching circuit connecting the back gate to the power source side and another switching circuit connecting the back gate to the input signal line in addition to the basic circuit of the transmission gate shown in FIG. 7. Further, in FIG. 1 and FIG. 2 the same constitutional elements as in FIG. 7 and FIG. 8 are designated by the same numerals and symbols and, therefore the explanations thereof are omitted.

In this embodiment, the source of the transistor 1 is connected to the input signal line and its drain is connected to the output signal line, the source of the transistor 2 is connected to the output signal line and its drain is connected to the input signal line, and the control signal c is an active high level "1". The switching circuits 3 and 4 are the same conductivity type as the transistor 2 and the switching circuits 103 and 104 are the same conductivity type as the transistor 1.

In the present embodiment, in order to render the connection of the switching circuits 103 and 104 effective, an N type buried separation layer is provided beneath the NMOS transistor region formed in a P type substrate to thereby separate the NMOS transistor 1 from the substrate. In other words, the back gate 1a thereof is disconnected from the substrate side. Thereby, the back gate 1a is also disconnected from the back gate of the PMOS transistor 2 formed in a well region. As a result, even if the switching circuits 103 and 104 are provided which are connected to the back gate 1a of the transistor 1, the potential of the back gate is never fixed to that of the substrate, thereby a modulation by an input signal A for the back gate 1a can be performed.

Now the operation thereof is explained. The switching circuit 104 connects the back gate 1a of the transistor 1 to the power source Vee (−) when there inverted signal *C (in other words, no control signal is generated). At this moment, the transistor 1 is rendered into an "OFF" condition. The switching circuit 103 connects the back gate 1a of the transistor 1 to an input signal line which is adapted to receive an input signal A when a control signal C is received. At this moment, the transistor 1 is rendered into an "ON" condition upon receipt of a control signal C.

Accordingly, when a control signal C is generated, the transistor 1 is rendered into an "ON" condition, and the back gate 1a is separated from the power source Vee (−) and modulated upon receipt of an input signal. Further, when no control signal is generated there is no inverted signal either, the back gate 1a is fixed to the power source Vee (−) and the transistor 1 is rendered into an "OFF" condition. Thereby, the so called conventional substrate modulation is performed even for the transistor 1.

Further, the transistor 2 operates in the same manner as explained in connection with FIG. 8. Namely, the switching circuit 4 connects the back gate 2a of the transistor 2 to the power source Vcc (+) when there is no control signal C (no inverted control signal *C) to render the transistor 2 into an "OFF" condition. The switching circuit 3 connects the back gate 2a of the transistor 2 to the input signal line which is adapted to receive an input signal when an inverted signal *C is received, and at this moment, the transistor 2 is rendered into an "ON" condition upon receipt of an inverted signal *C.

Figure 3:
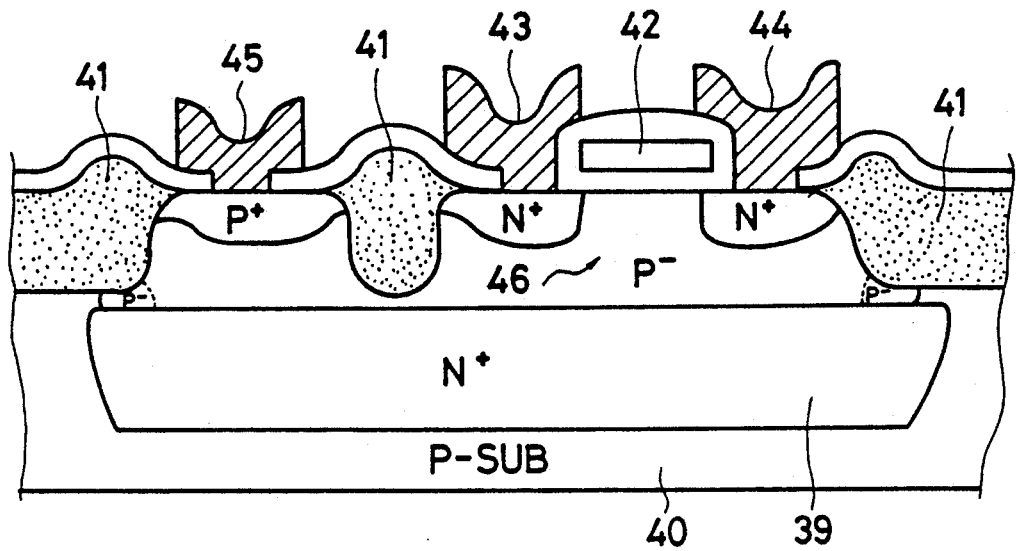
FIG. 3 is an explanatory view showing the cross sectional structure of an NMOS transistor for constituting the transmission gates according to the present invention.

Now, the buried separation layer provided beneath a transistor region is explained. In the present embodiment, an example of a CMOS is illustrated wherein a P channel MOS is formed by forming an N type well in a P type substrate and an N channel MOS is directly formed in the P type substrate. FIG. 3 shows a cross sectional structure of an NMOS transistor which is used in the present invention. As the structure of the P channel MOS formed in the N type well region is substantially the same as that of the conventional one, the illustration thereof is omitted.

Figure 4:
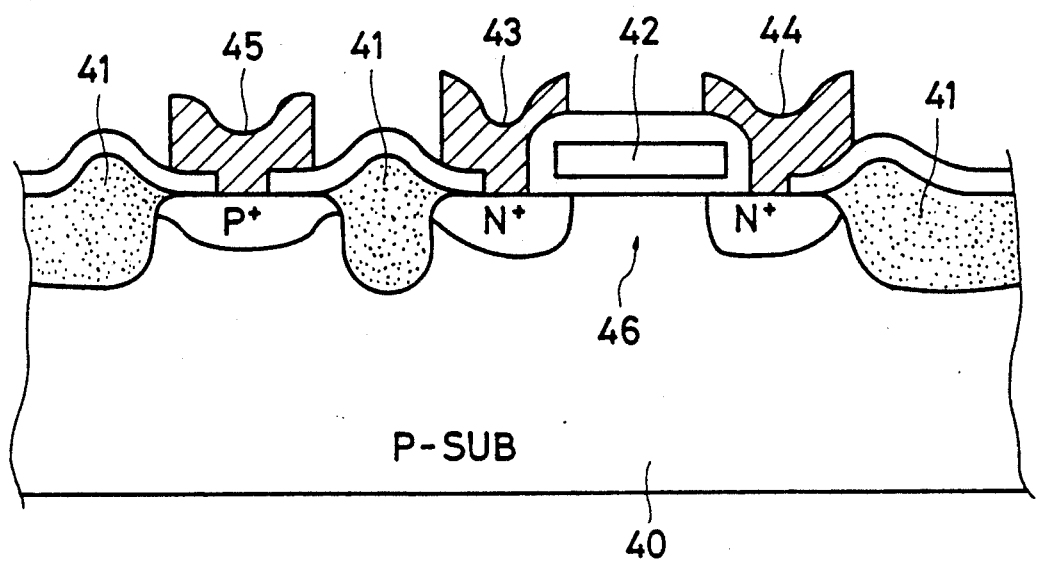
FIG. 4 is an explanatory view showing the cross sectional structure of a usual NMOS transistor.

In the drawing, 40 is P type substrate (P-SUB), 41 is a field oxide layer, 42 is a gate, 43 is a source wiring lead, 44 is a drain wiring lead and 46 is a back gate. The above elements are the same as those in a usual NMOS transistor, however the present NMOS transistor further comprises an N type buried separation region 39 and a wiring lead 45 which is connected to the back gate so as to connect the same to the others. For comparison, a cross sectional structure of a usual NMOS transistor is illustrated in FIG. 4 wherein the P type substrate 40 is directly connected to the back gate 46, and no layer corresponding to the N type buried separation layer 39 is provided. The buried separation layer can be formed by making use of such as channeling effect by an ion implantation device, which allows acceleration with a high voltage, and may include such as gettering function. The formation of such buried separation layer is well known in the field of the semiconductor production technology, the detailed explanation thereof is omitted.

As explained above, with the provision of the N type buried separation layer 39 beneath the NMOS transistor region the P type substrate 40 is separated from the transistor formation region including the back gate 46, thereby the respective back gates for the NMOS transistor formed in the substrate and the PMOS transistor formed in the well region are rendered independent. As a result, the respective transistors are independently modulated by an input signal.

Further, in case when an N type substrate is employed, a P type buried separation layer is provided beneath a PMOS transistor region and in such case the F type regions and the N type regions in FIG. 3 are respectively modified into N type regions and P type regions.

Figure 2:
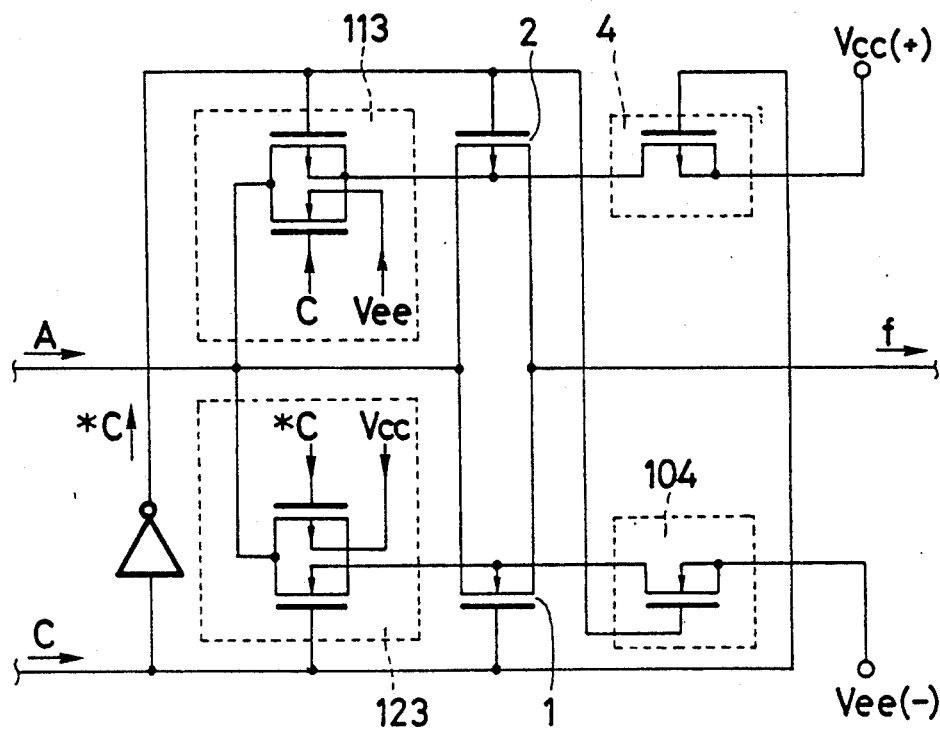
FIG. 2 is a circuit diagram showing the specific constitution of another embodiment of transmission gates according to the present invention.

FIG. 2 is another embodiment showing a specific constitution of transmission gates according to the present invention and the different constitution from that shown in FIG. 1 is that switching circuits 113 and 123 are provided in place of the switching circuits 3 and 103. The switching circuits 113 and 123 belong to a CMOS formed by connecting a PMOS transistor and an NMOS transistor in parallel to enhance the effect of the modulation by the input signal. As exemplified above the constitution of the respective switching circuits are not limited to those constituted by only one transistor but can be constituted by a plurality of transistors.

Figure 5:
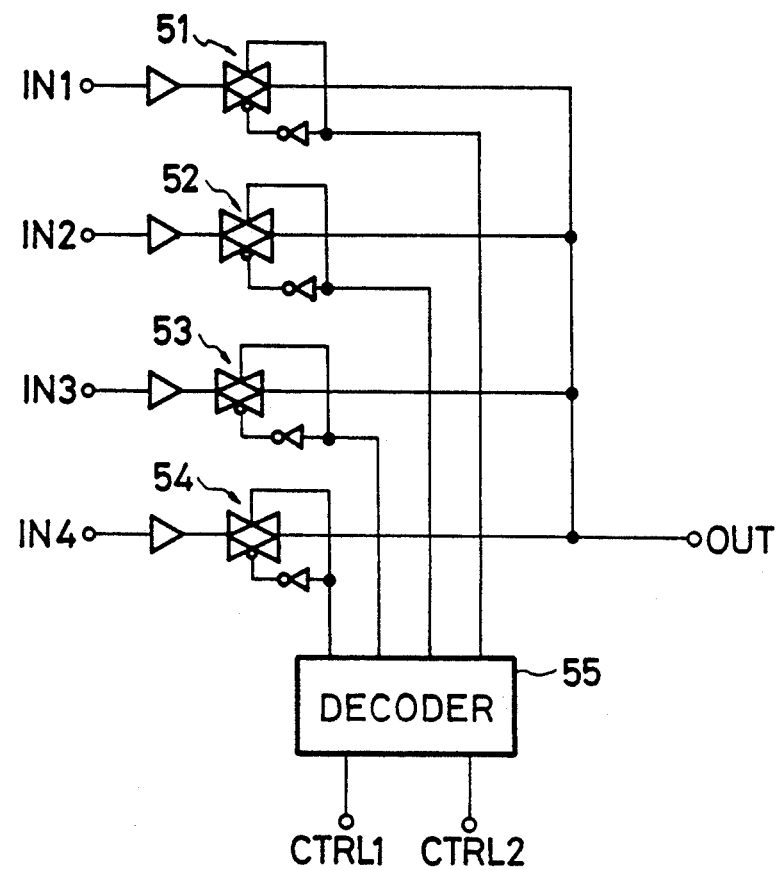
FIG. 5 is a block diagram of a selection circuit for an audio device to which the transmission gate according to the present invention is applied.

Further, FIG. 5 is an example of input signal selection circuits for an audio device, in an application example which uses four transmission gates (ones shown in FIG. 1 or FIG. 2) according to the present invention.

In this circuit, coded selection signals CRTL 1 and CRTL 2 are decoded by a decoder 55 and one of four control signals is outputted. Via the selected control signal one of the four transmission gates 51, 52, 53 and 54 is selected and rendered conductive and only the input signal inputted into the selected transmission gate is outputted as an output signal OUT.

As will be understood from the above, with the present transmission gate the distortion of an input signal is reduced, the transmission gate can be used not only for a switching circuit dealing with ordinary analogue signals but also for a switching circuit dealing with audio signals wherein the requirements with regard to noise and distortion are quite severe.

Figure 6:
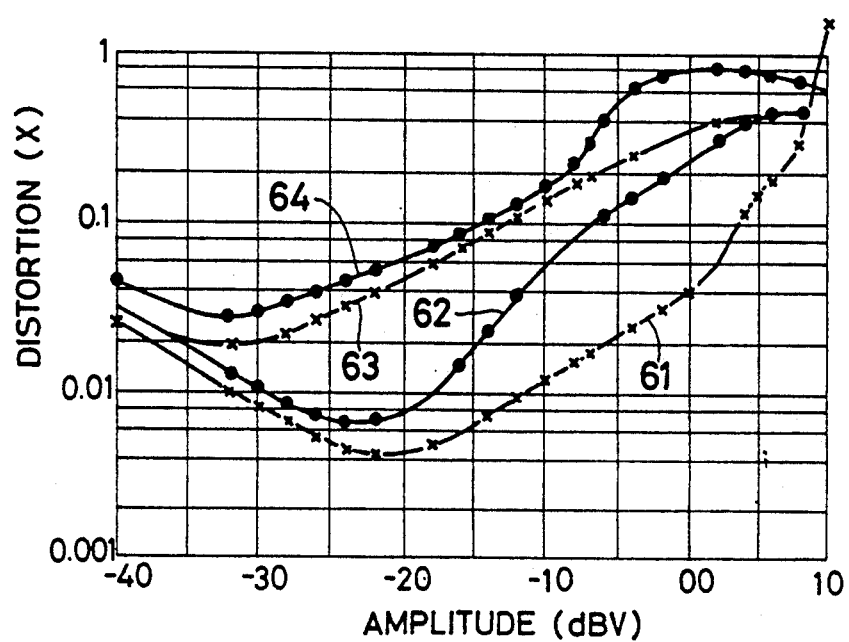
FIG. 6 is a characteristic diagram of transmission characteristics measured with the transmission gate having the constitution according to the present invention and a transmission gate having a conventional constitution.

FIG. 6 is a characteristic graph of transmission characteristics measured on the transmission gate having the constitution according to the present invention and on the transmission gate having the conventional constitution.

Both scales of the ordinate and abscissa are illustrated in logarithm. The ordinate indicates the magnitude of distortion included in the output signal in logarithmic scale and the abscissa indicates the amplitude of the input signal in logarithmic scale. In the measurement result, graph 64 represents a transmission characteristic of the circuit having a conventional constitution (see FIG. 7) wherein only a PMOS transistor and an NMOS transistor are connected in parallel. Graphs 62 and 63 represent transmission characteristics of the circuits having conventional constitutions (see FIG. 8) wherein a PMOS transistor and an NMOS transistor are connected in parallel and either one of the two transistors is modulated via the substrate. Graph 61 represents a transmission characteristic of the circuit having the constitution according to the present invention (see FIG. 1) wherein a PMOS transistor and an NMOS transistor are connected in parallel and the both transistors are modulated with the input signal. In comparison of the graphs 62~64 representing the measurement results for the conventional transmission gates with the graph 61 representing the present invention, it will be understood that with the present invention the distortion of the input signal is suppressed to the extent of $\frac{1}{2} \sim 1/10$ of the conventional one.

In the above embodiments of the present invention, the source side of the N channel MOS side is connected to a negative power source side, however when such as the input signal line and the output signal line are set at a neutral potential with respect to the positive power source, the source side of course can be grounded.

While a preferred embodiment has been set forth with specific details, further embodiments, modifications and variations are contemplated according to the broader aspects of the present invention, all as determined by the spirit and scope of the following claims.

I claim:

1. A transmission gate comprising,
   a CMOS circuit which is formed by connecting in parallel an N channel MOS transistor and a P channel MOS transistor between an input signal line and an output signal line; and
   a separation layer which separates a transistor formation region for one of the P channel MOS transistor and the N channel MOS transistor formed in a substrate from the substrate,
   wherein the respective back gates of the transistors are constituted to receive an input signal from the input signal line, when the transistor and the other transistor of the P channel MOS transistor and the N channel MOS transistor are rendered conductive.

2. A transmission gate according to claim 1, wherein said separation layer is formed in a buried layer having a different conductivity type from that of the substrate and the other transistor is formed in a well region.

3. A transmission gate according to claim 1, wherein the back gates of the respective transistors are connected to the input signal line via respective first switching circuits and connected to respective power source lines via respective second switching circuits.

. 4. A transmission gate according to claim 1, wherein the back gate of the one transistor is connected to the input signal line via a first switching circuit constituted by a transistor having the same conductivity type as that of the one transistor and is further connected to a first power source line via a second switching circuit constituted by a transistor having the same conductivity type as that in the first switching circuit, and the back gate of the other transistor is connected to the input signal line via a third switching circuit constituted by a transistor having the same conductivity type as the other transistor and is further connected to a second power source line via a fourth switching circuit constituted by a transistor having the same conductivity type as that in the third switching circuit.

5. A transmission gate comprising,
channel MOS transistor of which source is connected to an output signal line, of which drain is connected to an input signal line, of which back gate is connected to the input signal line via a first switching circuit and is further connected to a first power source line via a second switching circuit and of which gate is constituted to receive one of a control signal and its inverted signal; and
an N channel MOS transistor of which drain is connected to the output signal line, of which source is connected to the input signal line, of which back gate is connected to the input signal line via a third switching circuit and is further connected to a second power source line having a lower potential than that of the first power source, via a fourth switching circuit and of which gate is constituted to receive the other of the control signal and its inverted signal, and
wherein said P channel MOS transistor is formed in an N type well region formed in a P type substrate, and said N channel MOS transistor is formed in the substrate and includes an N type buried layer which separates the transistor formation region from the substrate.

6. A transmission gate according to claim 5, wherein the substrate is an N type conductivity, said N channel MOS transistor in place of said P channel MOS transistor is formed in a P type well region formed in the substrate and said P channel MOS transistor in place of said N channel MOS transistor is formed in the substrate and includes a P type buried layer which separates the transistor formation region from the substrate.

7. A transmission gate according to claim 5, wherein the first and second switching circuits are constituted by a P channel MOS transistor and the third and fourth switching circuits are constituted by an N channel MOS transistor.

8. A transmission gate according to claim 5, wherein the first and the third switching circuits are constituted by a CMOS circuit, the second switching circuit is constituted by a P channel MOS transistor and the fourth switching circuit is constituted by an N channel MOS transistor.

9. A transmission gate according to claim 5, wherein the first power source is a positive potential power source, the second power source is a negative potential power source and the inverted signal of the control signal is obtained by inverting the control signal via an inverter.

10. An integrated analog signal transmission gate, comprising:
a substrate;
an input signal line;
an output signal line;
a CMOS circuit having an N channel MOS transistor and a P channel MOS transistor formed in the substrate and conductively in parallel between the input signal line and the output signal line;
a separation layer conductively separating back gates of the P channel MOS transistor and the N channel MOS transistor from each other; and
switches connecting respective back gates of the transistors to receive respectively an input signal and an inversion of the input signal from the input signal line when the P channel MOS transistor and the N channel MOS transistor are conductive.

11. A transmission gate according to claim 10, wherein said separation layer is formed in a buried layer of the substrate having a different conductivity type from that of the substrate.

12. A transmission gate according to claim 10, wherein said switches include switching MOS transistors of conductivity type the same as respective ones of the N channel MOS transistor and the P channel MOS transistor.

13. A transmission gate according to claim 10, further including:
switching circuits connecting respective back gates of the transistors to receive respectively different polarity power source voltages only when the P channel MOS transistor and the N channel MOS transistor are not conductive.

14. A transmission gate according to claim 13, wherein said switches include switching MOS transistors of conductivity type the same as respective ones of the N channel MOS transistor and the P channel MOS transistor.

15. A transmission gate according to claim 14, wherein said separation layer is formed in a buried layer of the substrate having a different conductivity type from that of the substrate.

16. An analog signal transmission gate, comprising:
a substrate;
an input signal line;
an output signal line;
a CMOS circuit having an N channel MOS transistor and a P channel MOS transistor formed in the substrate and conductively in paralel between the input signal line and the output signal line;
a separation layer conductively separating back gates of the P channel MOS transistor and the N channel MOS transistor from each other; and
switching circuits connecting respective back gates of the transistors to receive respectively different polarity power source voltages only when the P channel MOS transistor and the N channel MOS transistor are not conductive.

17. A transmission gate according to claim 16, wherein said separation layer is formed in a buried layer of the substrate having a different conductivity type from that of the substrate.

18. A transmission gate according to claim 16, wherein said switches include switching MOS transistors of conductivity type the same as respective ones of the N channel MOS transistor and the P channel MOS transistor.

19. A transmission gate according to claim 18, wherein said separation layer is formed in a buried layer of the substrate having a different conductivity type from that of the substrate.

* * * * *